United States Patent [19]

Grotepass et al.

[11] Patent Number: 5,376,444
[45] Date of Patent: Dec. 27, 1994

[54] DIAMOND COATED WEAR RESISTANT TOOLS

[76] Inventors: Wilhelm P. Grotepass, 602 Adcock Street, Gezina, Pretoria, 0084, Transvaal; Pieter W. DeLange, 5 Garnet Place, Honeyhill, Roodepoort, 1725, Transvaal, both of South Africa

[21] Appl. No.: 196,898

[22] Filed: Feb. 15, 1994

Related U.S. Application Data

[63] Continuation of Ser. No. 736,457, Jul. 26, 1991, abandoned.

[30] Foreign Application Priority Data

Jul. 27, 1990 [ZA] South Africa .................. 90/5916
Sep. 14, 1990 [ZA] South Africa .................. 90/7345

[51] Int. Cl.$^5$ ............................................. B24D 3/06
[52] U.S. Cl. ........................................ 428/336; 51/295;
51/305; 51/307; 51/309; 428/408; 428/697; 428/698
[58] Field of Search ............... 428/408, 336, 698, 697; 51/295, 305, 307, 309

[56] References Cited

U.S. PATENT DOCUMENTS 4,142,869  3/1979  Vereschagin et al. ............. 51/295
4,694,918  9/1987  Hall .................................... 51/309

FOREIGN PATENT DOCUMENTS 0264674  4/1988  European Pat. Off. .

OTHER PUBLICATIONS

Westland, The Energy Requirement of the Dental Cutting Process, Journal of Oral Rehabilitation, 1980, vol. 7, pp. 51–63.

Primary Examiner—A. A. Turner
Attorney, Agent, or Firm—David M. Klein

[57] ABSTRACT

Diamond coated wear resistant articles particularly cutting tools such as surgical drills and burrs are coated with extremely hard coatings exhibiting compressive stress such as titanium nitride by means of physical vapor deposition to increase the wear resistance and, where applicable, the cutting performance of the article.

8 Claims, No Drawings

DIAMOND COATED WEAR RESISTANT TOOLS

This is a continuation of U.S. application Ser. No. 07/736,457, filed Jul. 26, 1991 now abandoned.

BACKGROUND OF THE INVENTION

This invention relates to articles having wear resistant surfaces and more particularly to tools having diamond coated wear resistant surfaces. In one form of the invention it relates to cutting tools and more particularly to diamond inset cutting tools.

In this specification, unless the context clearly indicates otherwise, the expression "articles having wear resistant surfaces" include bearings, sliding parts, articles subjected to wear as a result of the slipping of other elements thereover such as textile bobbins and cutting tools. The expression "cutting tool" is used in a general sense to denote any kind of tool which, in use, performs essentially a cutting action, at least when viewed at the microscopic level, by slicing or otherwise removing a piece or successive layers of material from a workpiece. Accordingly, the expression is intended to include, but not to be limited to, such equipment as saws, knives, drills, reamers, files, burrs, bits and surfaces coated for grinding application e.g. grinding wheels. The expression "diamond coated surface" as used in this specification is intended to cover both "diamond inset" surfaces as defined below and is specifically intended also to embrace surfaces onto which a coating of artificial diamond particles had been formed by the industrial process known in the trade as chemical vapor deposition [CVD] with or without plasma and/or microwave assistance. Such polycrystalline diamond nuclei formed by this deposition process may be formed on any suitable metallic or ceramic substrate including silicon carbide, tungsten carbide or natural diamond. The diamond coating may be of any required thickness but is typically a few microns thick. No bonding material is used for such CVD produced diamond coatings. Typically, we refer to the application of the 2,45 GHz microwave plasma CVD process in which a mixture of hydrogen and methane [1%] is used at a total gas flow rate of 100 cc/min, total pressure of 40 Torr, microwave power of 200 to 300 Watt and the substrate temperature between 880° C. and 980° C. A non-continuous layer of polycrystalline diamond nuclei, each nucleus about 10 microns in diameter, is thereby deposited on a WC substrate 1 mm diameter drill.

The expression "diamond inset" is herein intended to refer to any form of mounting diamonds or diamond dust particles on the working surface of any wear resistant article including any cutting tool and accordingly includes randomly scattered diamond dust particles held on the tool surface by being partially embedded in a matrix material. "Matrix material" is defined to be the bonding material such as nickel used when natural and artificial diamonds require bonding but it must also be read to refer to the substrate when CVD produced diamond coatings are referred to.

Diamond inset cutting tools are known to be used in various trades ranging from metal working equipment to surgical and dental drills and burrs. Such equipment generally comprises a working surface constituting a surface matrix into which the diamonds or diamond dust particles are set and well bonded. The matrix composition depends on the application of the tool in question but typically comprises a nickel-based alloy containing such elements as phosphorous, cobalt, wolfram and/or silicon. It is also known to use both natural and synthetic diamonds or a mixture thereof in producing diamond set cutting tools of the type in question.

The recently developed CVD produced polycrystalline diamond coated surfaces without any bonding has not yet found application as cutting tools due to the generally experienced and reported lack of adhesion of such produced coatings.

Although diamonds are very hard, diamond coated cutting tools wear relatively rapidly. It is, for example, the experience of dentists that a diamond coated burr may have a useful life allowing it to be used for tooth preparation of approximately 6 to 8 teeth. The wearing of such burrs and of other diamond set cutting tools is associated with two distinct processes. Firstly, the diamond dust particles may become dislodged from its mounting in the metallic matrix and secondly, the dust particles may be fractured along cleavage planes or fractures when impacted by the workpiece, such as a tooth, or by debris created during the working process. Such deterioration by particle loss and fractures in diamond burrs used in dental practice has been well demonstrated by Ir A. N. Westland in "The Energy Requirement of Dental Cutting Process" *Journal of Oral Rehabilitation,* 1980, Vol. 7, pp. 51–63.

Electronmicroscopic studies by the present applicants of the particles of diamond dust used on dental burrs have revealed that the dust particles often exhibit incomplete microfractures. It is believed that these incomplete microfractures constitute weak zones in the diamond dust particles and it is accordingly to be expected that the particles are in use prone to be fractured along such zones. Such fractured particles, along with dislodged particles, give rise to the presence of relatively large, very hard, loose bodies forming an abrasive grit in the working area which not only leads to the further fracturing or dislodgement of particles, but also leads to the erosion of the matrix thereby releasing, inter alia, nickel to the surrounding area. Nickel is a highly toxic element and its release during dental or bone surgery is accordingly most undesirable.

OBJECT OF THE INVENTION

It is an object of the present invention to provide a method of treating diamond coated articles and particularly diamond coated or diamond inset cutting tools to reduce the above shortcomings. The invention further relates to a diamond coated cutting tool treated by the process of the present invention.

SUMMARY OF THE INVENTION

According to the present invention a method of improving the wear characteristics of a diamond coated wear resistant article comprises the steps of applying to the diamond coated surface of the article a thin protective coating of a hard material which exhibits a compressive stress.

The expression "hard material which exhibits a compressive stress" is used to denote a hard material which has the inherent characteristic of having a compressive stress of such an intensity that a residual compressive stress will be exhibited by the coating when it is deposited on the diamonds and the bonding matrix or substrate. A similar residual compressive stress is believed to be exhibited by the hard coating when it is deposited on polycrystalline diamond coatings produced by the CVD process and on the limited exposed areas of the substrate.

The coating material is applied to the coated surface areas to obtain a strong adhesion between the coating and the coated surface.

The coating material may be any of the materials known in the trade as so-called extremely hard coatings. In the preferred form of the invention the coating material is selected from the group of coating materials which include the nitrides and carbides of titanium alloyed with other materials such as Al or W, and in particular titanium nitride [TiN], titanium aluminium nitride [TiAlN] and titanium wolfram nitride [TiWN].

Further according to the invention the coating layer is applied to the diamond coated surface of the tool by means of a process known in the trade as physical vapour deposition [PVD]. In the preferred form of the invention the coating is applied by the form of physical vapour deposition known as Magnetron Sputter Ion Plating [MSIP].

Where the coating layer comprises TiN, it is further preferred to apply such layer over a primary layer of Ti-metal during the MSIP process.

The thin protective coating is preferably no thicker than about 3,5 micron and is most preferably between about 0,5 and 3 micron in thickness but may generally be of any suitable thickness so long as it does not significantly impair the cutting characteristics of the tool in question and as long as the coating does not deteriorate by becoming brittle at the larger thicknesses.

The wear resistant article may be a cutting tool and is most preferably a diamond coated surgical cutting tool. In a specific application of the invention the cutting tool is a diamond set surgical drill, reamer or burr. Alternatively the tool may be a diamond coated surgical burr having polycrystalline nuclei particles deposited by the CVD process on the surface thereof without any bonding matrix.

The diamond particles on the wear resistant surface are preferably of a grid size smaller than 500 micron diameter and are most preferably in the range 5 to 150 micron.

The PVD and specifically MSIP techniques are known in the coating technology industry and accordingly do not per se form part of the present invention. However, it has not previously been suggested that these processes may be used to enhance the wear properties and extension of the application lifetime of diamond coated articles. In view of the fact that the hardness of, for example, a TiN layer deposited in this manner [Vickers hardness of about 2,000–2,800] is much lower than that of diamond [Vickers hardness of about 10,000] the observation by the applicants that such a coating has a beneficial effect on the wear characteristics of diamond coated articles such as diamond inset cutting tools in the form of dental surgical burrs is a most unexpected and surprising result.

According to a second aspect of the present invention there is provided a diamond coated wear resistant article characterised in that the diamond set surface thereof is coated with a firmly adhering thin hard coating which exhibits compressive stress.

The coating is preferably between about 0,5 and 3 microns in thickness and is preferably applied in a continuous or substantially continuous layer over the working surface of the tool constituted by the diamond particles and its supporting matrix or only the exposed substrate, where applicable, to exert a compressly stress on the individual coated diamond particles and also between the particles and the matrix or the exposed substrate areas where applicable in the case of CVD produced coatings.

The coating is preferably constituted by a layer of TiN, TiAlN or TiWN.

EXAMPLES OF THE INVENTION

Without limiting the scope of the present invention an example will now be described purely to illustrate one application of the invention.

EXAMPLE 1

Six commercially available diamond set dental burrs in which the matrix was composed of a nickel alloy containing about 93% Ni, 2,54% W, 1,69% Co and 1,18% Si were coated with a nominal 2 micron surface layer of TiN applied by magnetron sputtering ion-plating [MSIP] technology using standard coating parameters used in TiN applications to non-diamond substrates. The standard coating parameters developed by the British Company D.G. Teer Coating Services for their MSIP equipment, which they designed and manufactured, and which were, at our request, used by D.G. Teer Coating Services themselves to produce the TiN coatings on the dental burrs referred to in this application, are as follows:

Following an initial vacuum obtained of $5\times10^{-5}$ Torr, ion etching [$3\times10^{-3}$] Torr argon, 100 Volt bias, 0,2 Amp. magnetron current] was applied for 30 minutes. Deposition was started with 250 Volt bias, gradually increasing magnetron current for normal deposition conditions [for directly cooled targets of $8''\times4''$ sputter targets] to reach between 6 Amp. and 7 Amp. An optical emission spectrometer was used to control the $N_2$ flow valve. The changeover took 2 minutes so that a titanium layer, about 0,2 micron thick, was formed before TiN formation was executed for 30 minutes to produce a TiN coating of about 2 micron on the desired areas. Argon pressure at all times was kept at $3\times10^{-3}$ Torr.

The performance of the coated diamond burrs was compared with that of six similar but uncoated diamond set burrs. The aim of this study was to compare the wear characteristics of diamond burrs coated with TiN against that of uncoated burrs under controlled circumstances when cutting human teeth. The burrs were mounted in a straight handpiece with an electrical motor controlled by a regulated constant power supply. The burrs were all of 1,5 mm diameter having about 7 mm of the length thereof set with diamond particles of 100 micron grid size. The teeth were about 3 mm$\times$6 mm in size and the handpiece was arranged to utilize a central 3 mm zone of the burr to cut the teeth in two, that is to cut through a depth of about 6 mm in each tooth. The handpiece was mounted in an INSTRON testing machine controlling the feed and recording the pressure variance at a specific rate of cutting. The pressure required to achieve the selected rate of cutting or cross head speed [i.e. 10 mm per minute] was recorded by means of a load cell. This pressure is an indication of the cutting efficiency of the drill and bears a direct relationship to the heat generated during drilling or cutting.

In this test the uncoated burrs were typically found to be suitable for making cuts through about 6 to 8 teeth, that is, through a total depth of between 36 mm and 60 mm before becoming unserviceable as witnessed by the progressive increase in the required pressure and the eventual stalling of the electrical driving motor which was fed by the regulated constant power supply. The TiN coated diamond burrs were found to show no appreciable reduction in cutting performance [i.e. no significant increase in required pressure] after cutting through 25 teeth, that is through a total depth of about 150 mm, at which point the test was terminated.

The "as used" burrs following Instron testing were evaluated double blind by two calibrated independent evaluators [IED 5%] under a scanning electron microscope [JEOL JSM-840] at various magnifications. The data were analysed employing the Mann-Whitney-Wilcoxon-U test. A significant difference [p 0,05] was found between the TiN coated and uncoated burrs in respect of surface characteristics.

Inspection of the used burrs under scanning electronmicroscope revealed that the failure of the uncoated burrs was clearly due to loss of cutting particles on the cutting surface due either to dislodgment of the diamond particles or to breakages of the particles resulting in rounding of the cutting edges of the particles. In the coated diamond burrs the degree of deterioration of the diamond particles on the cutting surface was substantially less, both in terms of the dislodgement of diamond particles and in terms of breakages of the particles. Where breakages did occur it was noticeable that the TiN coating on the diamond particles in many instances split off the particle cutting edges thereby to expose the diamond cutting edges. It would appear that the remaining TiN coating adjacent to the cutting edges served to support the cutting edges and to assist in the preservation of the cutting edges due to the compressive stress exhibited by the TiN coating which compressive stress is a known feature of this type of coating.

EXAMPLE 2

A similarly coated burr [as described in Example 1] was handed to a dentist in private practice. After 6 months of continual use [typically drilling 4 to 6 cavities per day] the burr was still serviceable whereas a similar uncoated burr would be expected to fail after preparation of only 6 to 8 cavities.

General Discussion

It will be appreciated by those skilled in the art that similar results are obtainable with similarly applied ion plated extremely hard coatings which exhibit compressive stress such as TiAlN and TiWn, and the carbides of Titanium alloys.

Without wishing to be bound by any theory as to the reasons for the enhanced performance of a diamond set cutting tool coated with a very thin layer of an extremely hard material such as TiN, the applicants believe that the coating layer, inasmuch as it can be demonstrated to exert a compressly stress on substrates, diamonds or others after deposition, serves to hold the diamonds in position somewhat similar to the manner in which a so-called shrink wrap polymeric sheet is used in the packaging trade to unite a plurality of components in a single packed unit. The compressive layer also forms a bridge between the diamond and the matrix or substrate, where applicable, and hence may contribute to anchor the diamond to the matrix or substrate. Electronmicroscopic studies of a coated cutting tool also reveals that the deposited TiN in addition appears to penetrate into the incomplete microfractures of the diamond particles and into the crevices between the diamond particles and the Nickel alloy matrix and, it is accordingly believed, that it thereby serves as an additional bonding agent between the diamond and its matrix and possibly to reinforce or to repair the weak zones in the diamond.

Electronmicroscopic studies have further revealed that the layer of TiN deposited over the diamonds and its underlying matrix or substrate is not perfectly continuous. Continuity of the coating, when viewed on the level of microns is accordingly not essential for the present invention.

It is further believed that the low coefficient of friction of a TiN coating layer [0,16] also contributes to the success of the invention. The low coefficient of friction ensures that heat generation is minimised which result is highly desirable in the bone and dental surgery.

Since the TiN coating is harder than the matrix or substrate, it further serves to protect the matrix or substrate against corrosion and erosion during use and hence reduces the likelihood of release of nickel or any other substance from the matrix or the substrate which can cause undesirable contamination during application. As stated before, nickel contamination is highly undesirable in dental and bone surgery.

Many variations in detail of the invention may be devised without thereby departing from the spirit of the invention.

I claim:

1. A diamond coated wear resistant article comprising:
   a diamond coated working surface comprising diamond particles mounted in and bonded to a supporting matrix or substrate, at least a portion of the outer surface of some of the diamond particles being exposed; and
   a thin hard coating applied over the diamond coated working surface after the diamond particles have been mounted in the supporting matrix or substrate, the coating extending in a substantially continuous layer about 0.5 to 3 microns in thickness over the diamond coated working surface and exerting a compressive stress on the exposed portions of the individual diamond particles, and also exerting a compressive stress between the diamond particles and the supporting matrix or substrate for strengthening the bond therebetween,
   the thin hard coating comprising a layer of material selected from the group consisting of carbides of titanium and titanium alloys.

2. A diamond coated wear resistant article according to claim 1, wherein said thin, hard coating is applied to the diamond coated surface by means of physical vapor deposition (PVD) in the form known as Magnetron Sputter Ion Plating (MSIP).

3. The article of claim 1 wherein the coating comprises a layer of material selected from the group consisting of TiN, TiAlN and TiWN.

4. The article of claim 3 in the form of a dental tool selected from the group consisting of burrs, drills and reamers.

5. A diamond coated wear resistant article comprising:
   a diamond coated working surface comprising diamond particles mounted in and bonded to a supporting matrix or substrate, at least a portion of the outer surface of some of the diamond particles being exposed; and a thin hard coating applied over the diamond coated working surface after the diamond particles have been mounted in the supporting matrix or substrate, the coating extending in a substantially continuous layer about 0.5 to 3 microns in thickness over the diamond coated working surface and exerting a compressive stress on the exposed portions of the individual diamond particles, and also exerting a compressive stress between the diamond particles and the supporting matrix or substrate for strengthening the bond therebetween, the thin hard coating comprising a layer of material selected from the group consisting of nitrides of titanium and titanium alloys.

6. The article of claim 5 in the form of a dental tool selected from the group consisting of burrs, drills and reamers.

7. The article of claim 5, wherein said thin, hard coating is applied to the diamond coated surface by means of physical vapor deposition (PVD) in the form known as Magnetron Sputter Ion Plating (MSIP).

8. A diamond coated wear resistant article comprising:

a diamond coated working surface comprising diamond particles mounted in and bonded to a supporting matrix or substrate, at least a portion of the outer surface of some of the diamond particles being exposed, and at least a portion of the outer surface of the supporting matrix or substrate being exposed; and a thin hard coating covering the exposed portions of the diamond particles and substrate of the diamond coated working surface, the coating extending in a substantially continuous layer about 0.5 to 3 microns in thickness over the diamond coated working surface and exerting a compressive stress on the exposed portions of the individual diamond particles, and also exerting a compressive stress between the diamond particles and the supporting matrix or substrate for strengthening the bond therebetween, the thin hard coating comprising a layer of material selected from the group consisting of carbides and nitrides of titanium and titanium alloys.

* * * * *